(12) United States Patent
Sun et al.

(10) Patent No.: US 12,543,564 B2
(45) Date of Patent: Feb. 3, 2026

(54) INTEGRATED CIRCUIT PACKAGE AND METHOD

(71) Applicant: Taiwan Semiconductor Manufacturing Co., Ltd., Hsinchu (TW)

(72) Inventors: Sey-Ping Sun, Hsinchu (TW); Shih Wei Liang, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 726 days.

(21) Appl. No.: 17/812,767

(22) Filed: Jul. 15, 2022

(65) Prior Publication Data

US 2024/0021488 A1 Jan. 18, 2024

(51) Int. Cl.
| | |
|---|---|
| H01L 23/367 | (2006.01) |
| H01L 23/00 | (2006.01) |
| H01L 23/373 | (2006.01) |
| H01L 23/48 | (2006.01) |
| H01L 25/065 | (2023.01) |

(52) U.S. Cl.
CPC ........ *H01L 23/367* (2013.01); *H01L 23/3736* (2013.01); *H01L 23/481* (2013.01); *H01L 24/05* (2013.01); *H01L 24/08* (2013.01); *H01L 24/80* (2013.01); *H01L 25/0657* (2013.01); *H01L 2224/08145* (2013.01); *H01L 2224/80379* (2013.01); *H01L 2224/80896* (2013.01); *H01L 2924/05032* (2013.01); *H01L 2924/05432* (2013.01)

(58) Field of Classification Search
CPC . H01L 23/367; H01L 23/3736; H01L 23/481; H01L 24/05; H01L 24/08; H01L 24/80; H01L 2224/08145; H01L 2224/80379; H01L 2224/80896; H01L 2924/05032; H01L 2924/05432; H01L 25/0657
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |

(Continued)

FOREIGN PATENT DOCUMENTS

| | | |
|---|---|---|
| CN | 111554671 A | 8/2020 |
| TW | 200824071 A | 6/2008 |

(Continued)

*Primary Examiner* — Brigitte A Paterson
(74) *Attorney, Agent, or Firm* — Slater Matsil, LLP

(57) ABSTRACT

A device package includes a first die comprising a semiconductor substrate; an isolation layer on the semiconductor substrate, wherein the isolation layer is a first dielectric material; a first dummy via penetrating through the isolation layer and into the semiconductor substrate; a bonding layer on the isolation layer, wherein the bonding layer is a second dielectric material that has a smaller thermal conductivity than the first dielectric material; a first dummy pad within the bonding layer and on the first dummy via; a dummy die directly bonded to the bonding layer; a second die directly bonded to the bonding layer and to the first dummy pad; and a metal gap-fill material between the dummy die and the second die.

20 Claims, 13 Drawing Sheets

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2008/0116569 A1 | 5/2008 | Huang et al. | |
| 2014/0159222 A1 | 6/2014 | Hong et al. | |
| 2017/0110438 A1 | 4/2017 | Chen et al. | |
| 2020/0043892 A1 | 2/2020 | Wu et al. | |
| 2020/0161263 A1* | 5/2020 | Chen | H01L 24/06 |
| 2020/0243497 A1* | 7/2020 | Hsu | H01L 21/4857 |
| 2020/0258847 A1 | 8/2020 | Pietambaram et al. | |
| 2021/0328367 A1 | 10/2021 | Tang et al. | |
| 2023/0145610 A1 | 5/2023 | Chen et al. | |
| 2023/0335518 A1* | 10/2023 | Lei | H10H 29/142 |

FOREIGN PATENT DOCUMENTS

| | | |
|---|---|---|
| TW | 201428908 A | 7/2014 |
| TW | 202139373 A | 10/2021 |

* cited by examiner

INTEGRATED CIRCUIT PACKAGE AND METHOD

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a tend toward smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
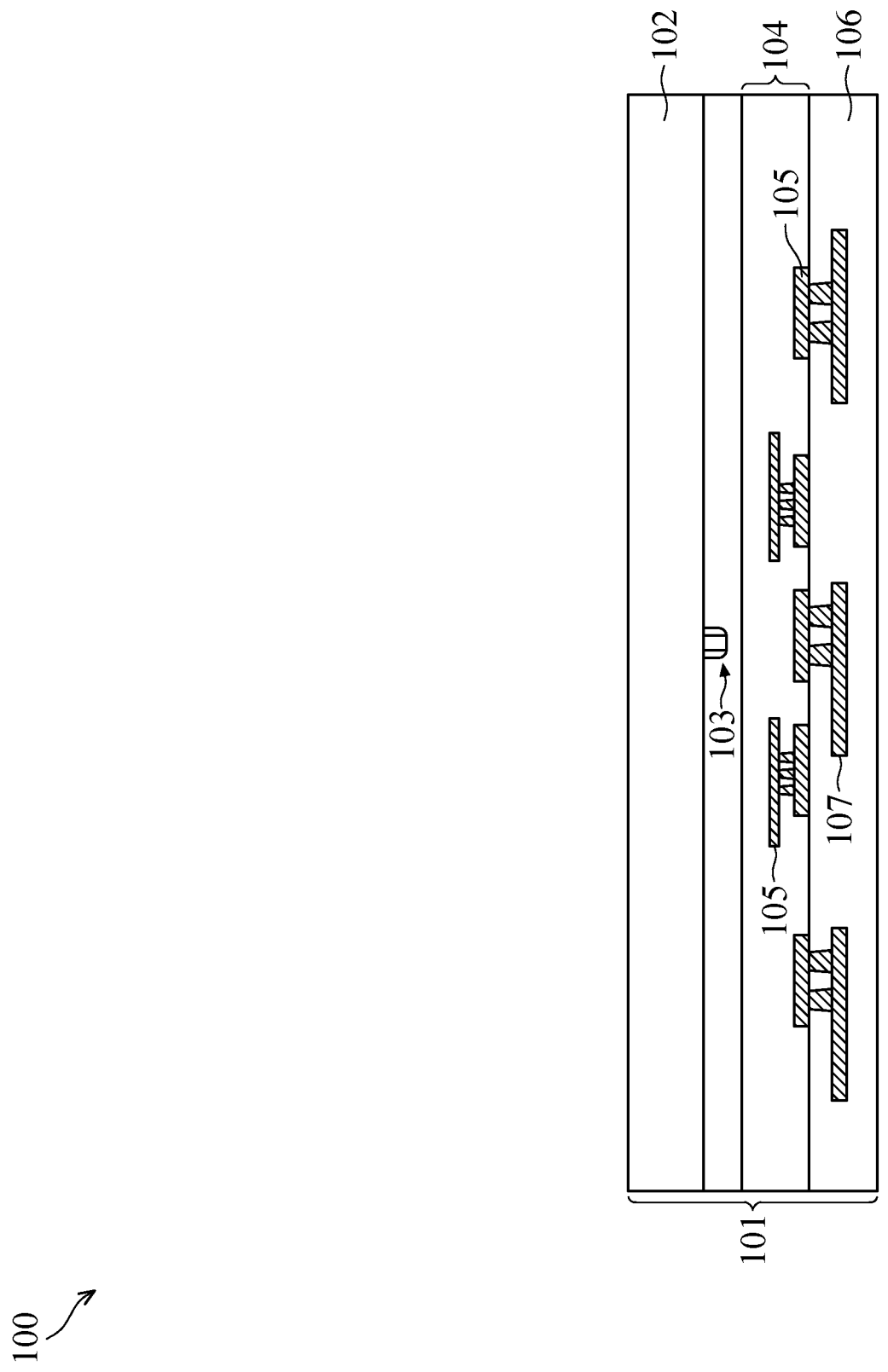
FIGS. 1, 2, 3, 4, 5, 6, 7A, 7B, 8, and 9 illustrate cross-sectional views and top-down views of intermediate steps in the manufacturing of a semiconductor package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, semiconductor devices may be bonded together to provide a 3D integrated chip (3DIC) package, such as a system on integrated chip (SoIC) package. In some embodiments, heat may be dissipated away from the bottom semiconductor device by metal heat dissipation structures. The metal heat dissipation structures may include, for example, dummy vias, dummy bond pads, and dummy gap-filling regions. The metal heat dissipation structures may be adapted to a particular configuration based on package device and/or thermal management requirements of a device. In some embodiments, an isolation layer may be formed of an insulating high thermal conductivity material. The isolation layer and various bonding layers may be thinned or omitted to reduce thermal resistance. Advantages may be achieved by the various embodiments described herein. The advantages include high thermal dissipation efficiency, targeted hot spot management by overlapping heat dissipation features with device hot spots, ease of integration with SoIC processes, ease of manufacturing and adaptation to different package configurations (e.g., different package component shapes and/or dimensions).

FIGS. 1, 2, 3, 4, 5, 6, 7A, 8, and 9 are cross-sectional views of intermediate steps of a process for forming a semiconductor package 100 (see FIG. 9), in accordance with some embodiments. FIG. 7B is a top-down view of a structure similar to that shown in FIG. 7A, in accordance with some embodiments. Referring to FIG. 1, a semiconductor die 101 is illustrated, in accordance with some embodiments. The semiconductor die 101 may be a bare chip semiconductor die (e.g., unpackaged semiconductor die) that is formed as part of a larger wafer. For example, the semiconductor die 101 may be a logic die (e.g., application processor (AP), central processing unit (CPU), graphics processing unit (GPU), microcontroller, etc.), a memory die (e.g., dynamic random access memory (DRAM) die, hybrid memory cube (HBC), (HMC), a static random access memory (SRAM) die, a wide input/output (wideIO) memory die, a magnetoresistive random access memory (MRAM) die, a resistive random access memory (RRAM) die, etc.), a power management die (e.g., a power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), a biomedical die, the like, or a combination thereof.

The semiconductor die 101 may be processed according to applicable manufacturing processes to form integrated circuits in the semiconductor die 101, in accordance with some embodiments. For example, the semiconductor die 101 may include a semiconductor substrate 102. The semiconductor substrate 102 may be, for example, a bulk semiconductor substrate, a semiconductor-on-insulator (SOI) substrate, a multi-layered semiconductor substrate, or the like. The semiconductor substrate 102 may include a semiconductor material such as silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 102 may be doped or undoped. The semiconductor substrate 102 has an active surface (e.g., the surface facing downward in FIG. 1), sometimes called a front side, and an inactive surface (e.g., the surface facing upward in FIG. 1), sometimes called a back side.

Devices (represented by a transistor) 103 may be formed in and/or on the semiconductor substrate 102. The devices 103 may be formed at the front side of the semiconductor substrate 102. The devices 103 may include active devices (e.g., transistors, diodes, etc.), passive devices (e.g., capacitors, resistors, etc.), and/or other circuit components. In various embodiments, some of the devices 103 generate relatively high levels of heat during operation. In some embodiments, some of the devices 103 may be formed in an active layer (not separately labeled) on the semiconductor substrate 102 and may be surrounded by isolation regions (e.g., shallow trench isolation (STI) regions or the like). The devices 103 may be formed using any suitable techniques.

In some embodiments, the devices may be interconnected by an interconnect structure 104 comprising, for example, conductive features 105 such as metallization patterns, metal lines, metal vias, metal pads, or the like that are disposed in one or more dielectric layers over the semiconductor substrate 102. The interconnect structure 104 electrically connects the devices 103 to form one or more integrated circuits. The conductive features 105 may include contact pads which allow connections to be made to the interconnect structure 104 and the devices 103. The dielectric layer(s) may comprise silicon oxide, silicon oxynitride, silicon nitride, other low-k materials, polymer materials, the like, or combinations thereof.

The semiconductor die 101 may be formed as part of a larger wafer, and multiple semiconductor die 101 may be formed on a single wafer, in some embodiments. In some embodiments, the semiconductor die 101 formed on the wafer may be subsequently singulated from each other using a sawing process or the like. In some embodiments, a chip probe (CP) test may be applied to each of the semiconductor die 101 (e.g., through the contact pads of the interconnect structure 104). The CP test checks electrical functionality of the semiconductor die 101, and dies that pass the CP tests are referred to as known good dies (KGDs). Semiconductor dies 101 that do not pass the CP tests are discarded or repaired. In this manner, KGDs are provided for packaging, which can reduce waste and expense of packaging a faulty die.

After the CP tests, one or more dielectric layers 106 may be formed over the interconnect structure 104 of each KGD, in some embodiments. The dielectric layer(s) 106 may comprise silicon oxide, silicon oxynitride, silicon nitride, or the like. The dielectric layer(s) 106 may protect the contact pads during subsequent packaging processes. In some embodiments, additional interconnection may be provided by metallization patterns 107 disposed in the dielectric layer(s) 106.

Figure 2:
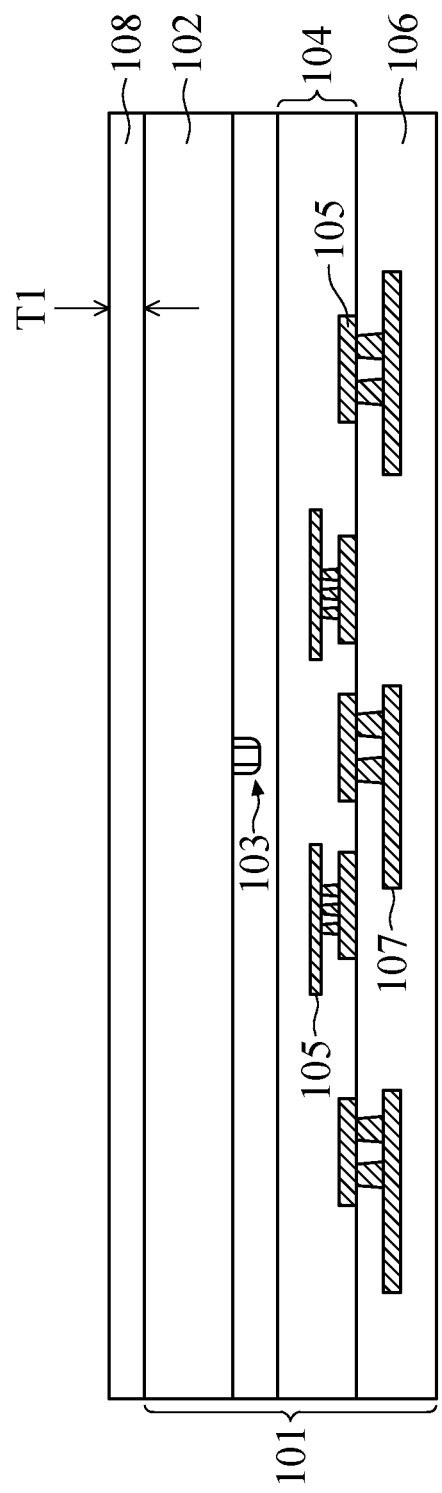

In FIG. 2, an isolation layer 108 is formed over the back side of the semiconductor substrate 102, in accordance with some embodiments. The isolation layer 108 may be formed to protect and isolate the semiconductor die 101 from subsequent processing steps. The material of the isolation layer 108 may be an insulating material and/or a material suitable for dielectric-to-dielectric bonding. The isolation layer 108 may be formed using a suitable technique, such as ALD, CVD, PVD, or the like. In some embodiments, the isolation layer 108 is formed having a thickness T1 that is in the range of about 2000 Å to about 1 μm. Other thicknesses T1 are possible.

In some embodiments, the isolation layer 108 is formed of an insulating material having a relatively large thermal conductivity, such as a thermal conductivity larger than about 100 W/m-° K. For example, in some embodiments, the isolation layer 108 may be formed of a material such as aluminum oxide ($Al_2O_3$), aluminum nitride (AlN), the like, or a combination thereof. By forming the isolation layer 108 of a material that has a large thermal conductivity, the heat generated by the devices 103 may be more effectively dissipated into overlying thermal structures such as the thermal structures 160 or the thermal fill regions 170 (see FIGS. 7A-7B).

Other materials are possible for the isolation layer 108. For example, in other embodiments, the isolation layer 108 is formed of an insulating material having a relatively small thermal conductivity, such as a thermal conductivity smaller than about 2 W/m-° K. For example, the isolation layer 108 may be formed of silicon oxide, silicon oxynitride, silicon nitride, the like, or a combination thereof. In some embodiments, the isolation layer 108 is subsequently thinned (see FIG. 4) to improve heat dissipation through the isolation layer 108.

Figure 3:
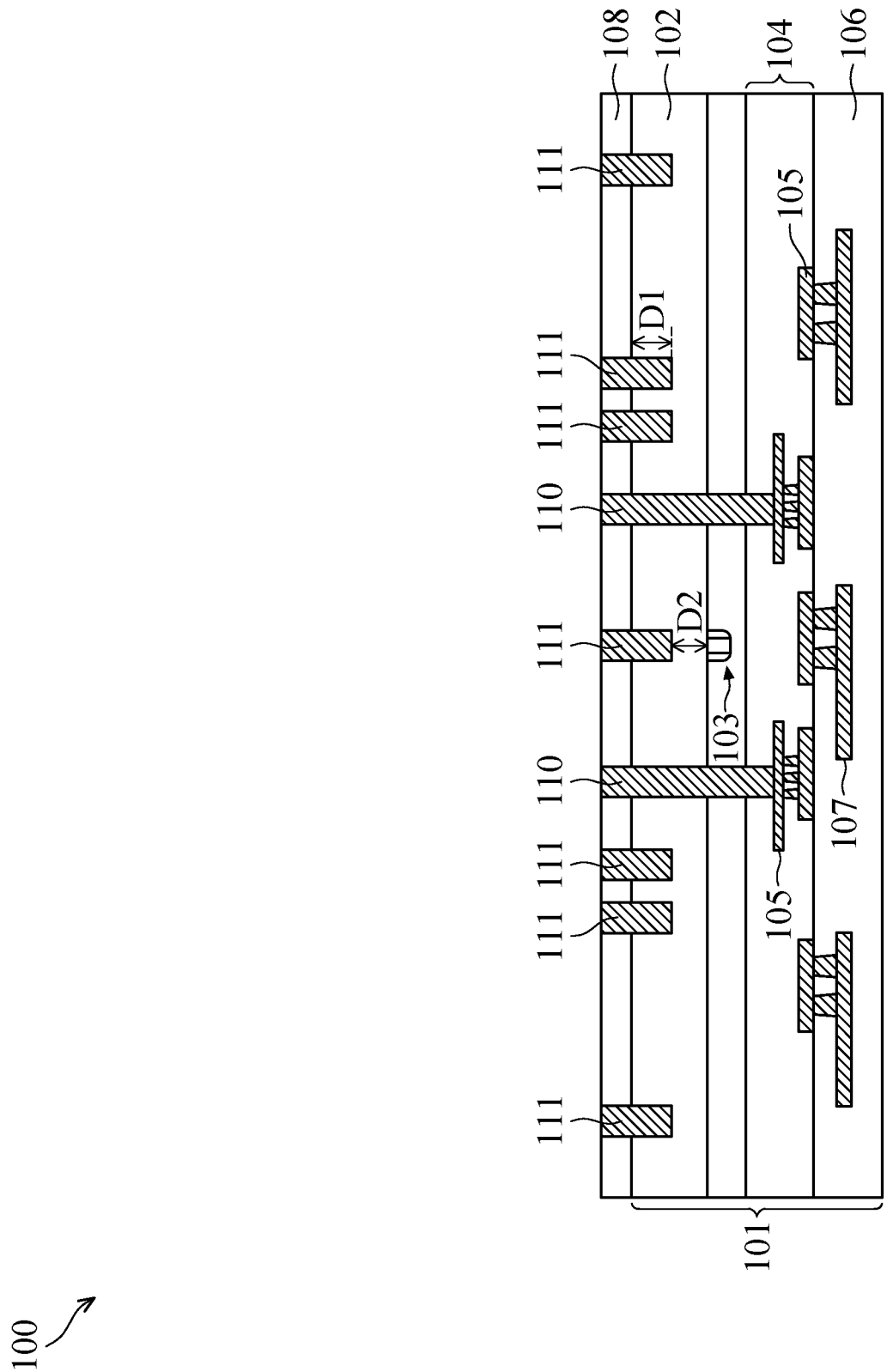

In FIG. 3, through vias 110 and thermal vias 111 are formed, in accordance with some embodiments. The through vias 110 are formed extending through the isolation layer 108 and the semiconductor substrate 102 to make physical and electrical contact to conductive features 105 of the interconnect structure 104. The thermal vias 111 are formed extending through the isolation layer 108 and penetrating at least partially into the semiconductor substrate 102 to provide improved dissipation of heat from the devices 103. In this manner, the thermal vias 111 may be considered "dummy vias." In other embodiments, thermal vias 111 are not formed.

The through vias 110 may be formed, for example, by etching openings through the isolation layer 108, the semiconductor substrate 102, and other layers to expose conductive features 105. The openings may be etched using suitable photolithography and etching techniques, for example. In some embodiments, an optional barrier layer may be conformally deposited in the openings, such as using ALD, CVD, PVD, thermal oxidation, the like, or a combination thereof. The barrier layer may be formed of an oxide, a nitride, a carbide, the like, or a combination thereof. A conductive material may then be deposited over the barrier layer and in the openings. The conductive material may be formed using an electro-chemical plating process, CVD, ALD, PVD, the like, or a combination thereof. Examples of conductive materials are copper, tungsten, aluminum, silver, gold, the like, or a combination thereof. Excess conductive material and barrier layer may be removed from a surface of the isolation layer 108 using a planarization process such as a chemical-mechanical polish (CMP) process or the like. Remaining portions of the barrier layer and conductive material form the through vias 110. Other materials or formation techniques are possible.

The thermal vias 111 may be formed using techniques similar to those of the through vias 110. For example, openings may be etched through the isolation layer 108 and partially into the semiconductor substrate 102. An optional barrier layer may be deposited in the openings, and then conductive material may be deposited over the barrier layer. In some embodiments, the thermal vias 111 extend from the back side surface of the semiconductor substrate 102 a distance D1 into the semiconductor substrate 102 that is in the range of about 4 μm to about 6 μm. In some embodiments, the thermal vias 111 are vertically separated from the devices 103 (e.g., from the front side surface of the semiconductor substrate 102) by a distance D2 in the range of about 3 μm to about 5 μm. In some embodiments, the thermal vias 111 have width in the range of about 1 µm to about 2 µm. Other distances or widths are possible, and thermal vias 111 having a variety of distances or widths may be formed in the same structure. In some cases, thermal vias 111 having larger distances D1, smaller distances D2, and/or larger widths may allow for more efficient heat dissipation. Excess conductive material and barrier layer may be removed from a surface of the isolation layer 108 using a planarization process such as a CMP process or the like. Remaining portions of the barrier layer and conductive material form the thermal vias 111. The through vias 110 and the thermal vias 111 may share formation steps. For example, the formation of the through vias 110 and the thermal vias 111 may use the same etching step, the same barrier layer deposition step, the same conductive material deposition step, and/or the same planarization step. Other materials or formation techniques are possible.

Figure 4:
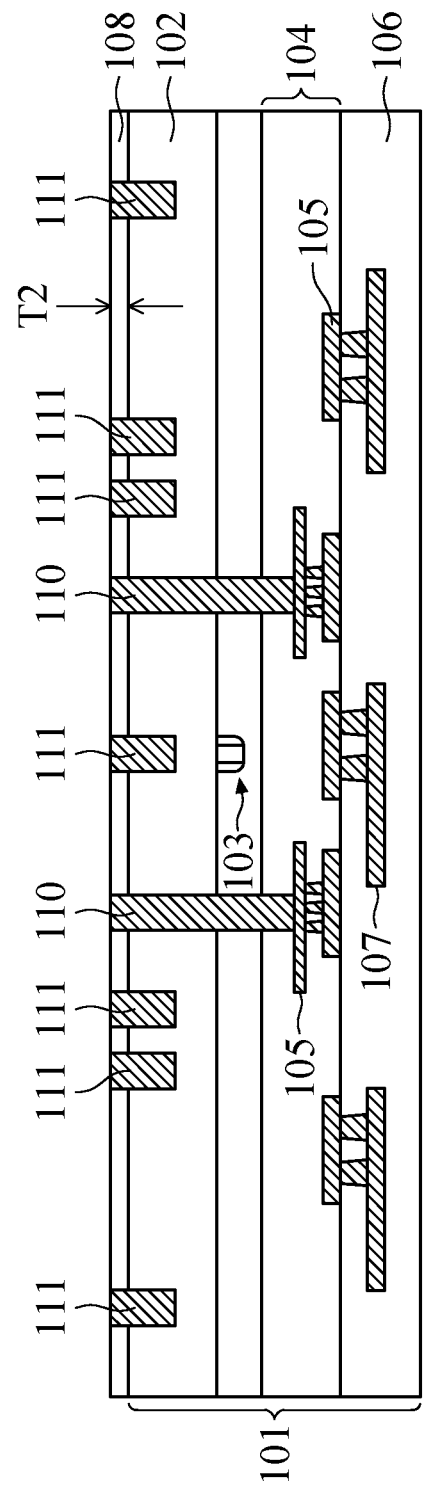

In FIG. 4, an optional thinning process is performed to thin the isolation layer 108, in accordance with some embodiments. The thinning process may comprise a CMP process or the like, and may combined with the planarization process described for FIG. 3, in some embodiments. In some cases, thinning the isolation layer 108 can improve the dissipation of heat through the isolation layer 108. For example, in some embodiments in which the isolation layer 108 is formed of a material having a relatively small thermal conductivity, thinning the isolation layer 108 can improve the heat dissipation through the isolation layer 108 despite its relatively small thermal conductivity. In some embodiments, the isolation layer 108 is not thinned. For example, the isolation layer 108 may not be thinned for some embodiments in which the isolation layer 108 is formed of a material having a relatively large thermal conductivity. In some embodiments, the isolation layer 108 may be thinned and formed of a material having a relatively large thermal conductivity. In some embodiments, after performing the thinning process, the isolation layer 108 may have a thickness T2 that is less than about 500 Å, such as a thickness T2 that is in the range of about 100 Å to about 500 Å. Other thicknesses T2 are possible.

Figure 5:
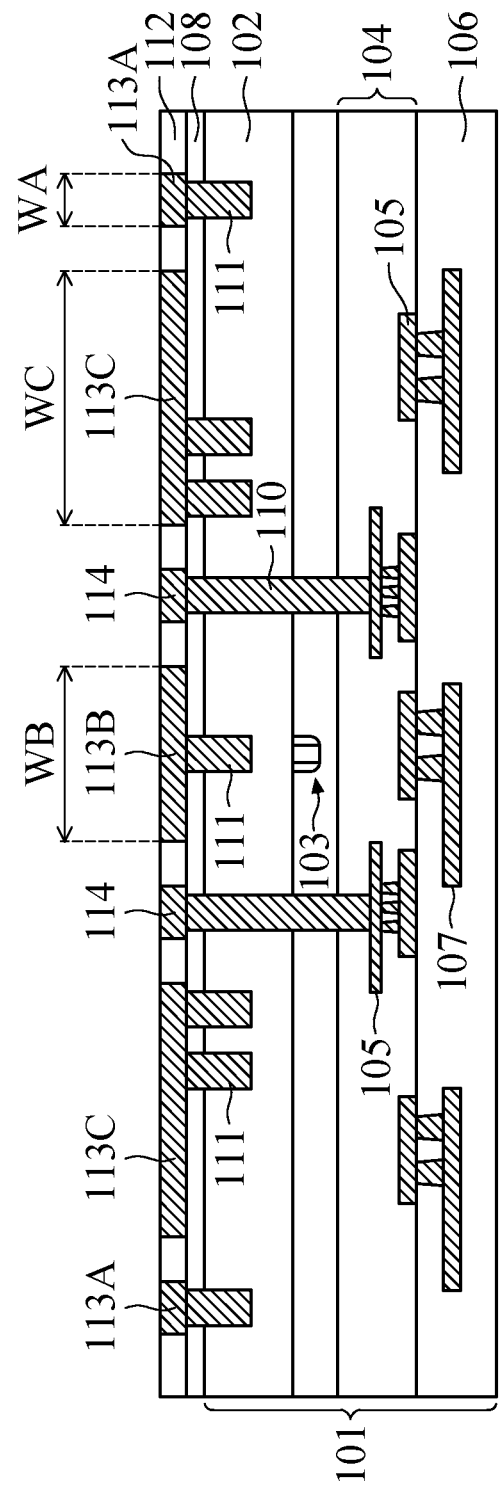

In FIG. 5, a bonding layer 112, thermal pads 113 (e.g., thermal pads 113A-C), and bonding pads 114 are formed over the isolation layer 108, in accordance with some embodiments. The bonding layer 112, thermal pads 113, and/or the bonding pads 114 may be used for bonding other structures in subsequent process steps. For example, the bonding layer 112 may be used for a bonding process such as direct bonding, fusion bonding, dielectric-to-dielectric bonding, oxide-to-oxide bonding, or the like. The thermal pads 113 and/or the bonding pads 114 may be used for a bonding process such as direct bonding, fusion bonding, metal-to-metal bonding, or the like. In some embodiments, the bonding layer 112, the thermal pads 113, and the bonding pads 114 are all utilized for bonding (e.g., "hybrid bonding").

In some embodiments, the bonding layer 112 is formed of a silicon-containing dielectric material such as silicon oxide, silicon nitride, silicon oxynitride, or the like. Other materials are possible. The bonding layer 112 may be deposited using any suitable method, such as, ALD, CVD, PVD, or the like. In some embodiments, the bonding layer 112 may be formed having a thickness in the range of about 200 nm to about 900 nm, though other thicknesses are possible. In some embodiments, the bonding layer 112 is subsequently thinned, which is described in greater detail below for FIGS. 10-11. In other embodiments, the bonding layer 112 is not formed, which is described in greater detail for FIG. 12. In some embodiments, the thermal conductivity of the material of the bonding layer 112 may be less than the thermal conductivity of the material of the isolation layer 108.

The thermal pads 113, and the bonding pads 114 may be formed and disposed in the dielectric layer 224. In some embodiments, the thermal pads 113 and the bonding pads 114 are similar, except that bonding pads 114 are also used to make electrical connections (e.g., to through vias 110). In some cases, the thermal pads 113 may be electrically isolated and may be used to facilitate the dissipation of heat away from the thermal devices 103. In this manner, the thermal pads 113 may be considered "dummy pads," in some cases. In some cases, the thermal pads 113 and/or the bonding pads 114 may extend on a top surface of the isolation layer 108, as shown in FIG. 5. As shown in FIG. 5, bonding pads 114 may physically and electrically contact through vias 110, and thus may be electrically coupled to the interconnect structure 104. Similarly, thermal pads 113 may physically contact one or more thermal vias 111, in some embodiments. In some cases, thermal pads 113 may be formed that do not physically contact thermal vias 111.

The thermal pads 113 and the bonding pads 114 may be formed either before or after the bonding layer 112 is formed. The thermal pads 113 and the bonding pads 114 may comprise copper or the like and be formed by a plating process, a damascene process, or the like. In some embodiments, the thermal pads 113 and the bonding pads 114 may be formed of materials similar to those of the through vias 110 and thermal vias 111.

As an example, the thermal pads 113 and the bonding pads 114 may be simultaneously formed by first forming openings (not separately illustrated) within the bonding layer 112. The openings may be formed, for example, by applying and patterning a photoresist over the top surface of the bonding layer 112, then etching the bonding layer 112 using the patterned photoresist as an etching mask. The bonding layer 112 may be etched by dry etching (e.g., reactive ion etching (RIE), neutral beam etching (NBE), or the like), wet etching, or the like. In accordance with some embodiments of the present disclosure, the etching stops on the isolation layer 108 such that through vias 110 and/or thermal vias 111 are exposed through the openings in the bonding layer 112. Other techniques of forming the bond openings are possible.

Conductive material may then be deposited in the openings to form the thermal pads 113 and the bonding pads 114, in some embodiments. In an embodiment, the conductive material may comprise a barrier layer, a seed layer, a fill metal, or a combination thereof. For example, a barrier layer may first be blanket deposited over the bonding layer 112 and within the openings. The barrier layer may comprise titanium, titanium nitride, tantalum, tantalum nitride, the like, or a combination thereof. The seed layer may be a conductive material such as copper and may be blanket deposited over the barrier layer using a suitable process, such as sputtering, evaporation, plasma-enhanced chemical vapor deposition (PECVD), or the like. The fill metal may be a conductive material such as copper, copper alloy, aluminum, or the like, and may be deposited using a suitable process, such as electroplating, electroless plating, or the like. The fill metal may fill or overfill the openings, in some embodiments. Once the fill metal has been deposited, excess material of the fill metal, the seed layer, and the barrier layer may be removed using, for example, a planarization process such as a CMP process. After the planarization process, top surfaces of the bonding layer 112, the thermal pads 113, and/or the bonding pads 114 may be substantially level or coplanar, in some cases.

The thermal pads 113 may be formed having different widths, and three example thermal pads 113 of different widths are shown in FIG. 5 as thermal pads 113A, 113B, and 113C. For example, thermal pads 113A have a width WA, thermal pads 113B have a width WB that is larger than the width WA, and thermal pads 113C have a width WC that is larger than the width WB. For example, the width WA may represent a width in the range of about 2 μm to about 5 μm, the width WB may represent a width in the range of about 5 μm to about 10 μm, and the width WC may represent a width that is greater than about 100 μm. These are examples, and other widths or combinations of widths are possible.

In some cases, forming a thermal pad 113 having a larger width can provide improved dissipation of heat from an underlying device 103. For example, in some cases, the use of a thermal pad 113B having a width WB of about 5 μm or greater may reduce the thermal resistance of a region around a device 103 by about 9% or more, relative to the thermal resistance when a thermal pad 113A having a width WA of less than about 5 μm is used. A reduced thermal resistance corresponds to improved heat dissipation. Other reductions to thermal resistance are possible when using a wider thermal pad 113, and may depend on the particular materials or geometry of the region around a device 103. In some cases, heat dissipation may be further improved by using additional thermal pads 113 that extend underneath two or more overlying structures. This is described in greater detail below for the thermal pads 113C shown in FIG. 6.

Figure 6:
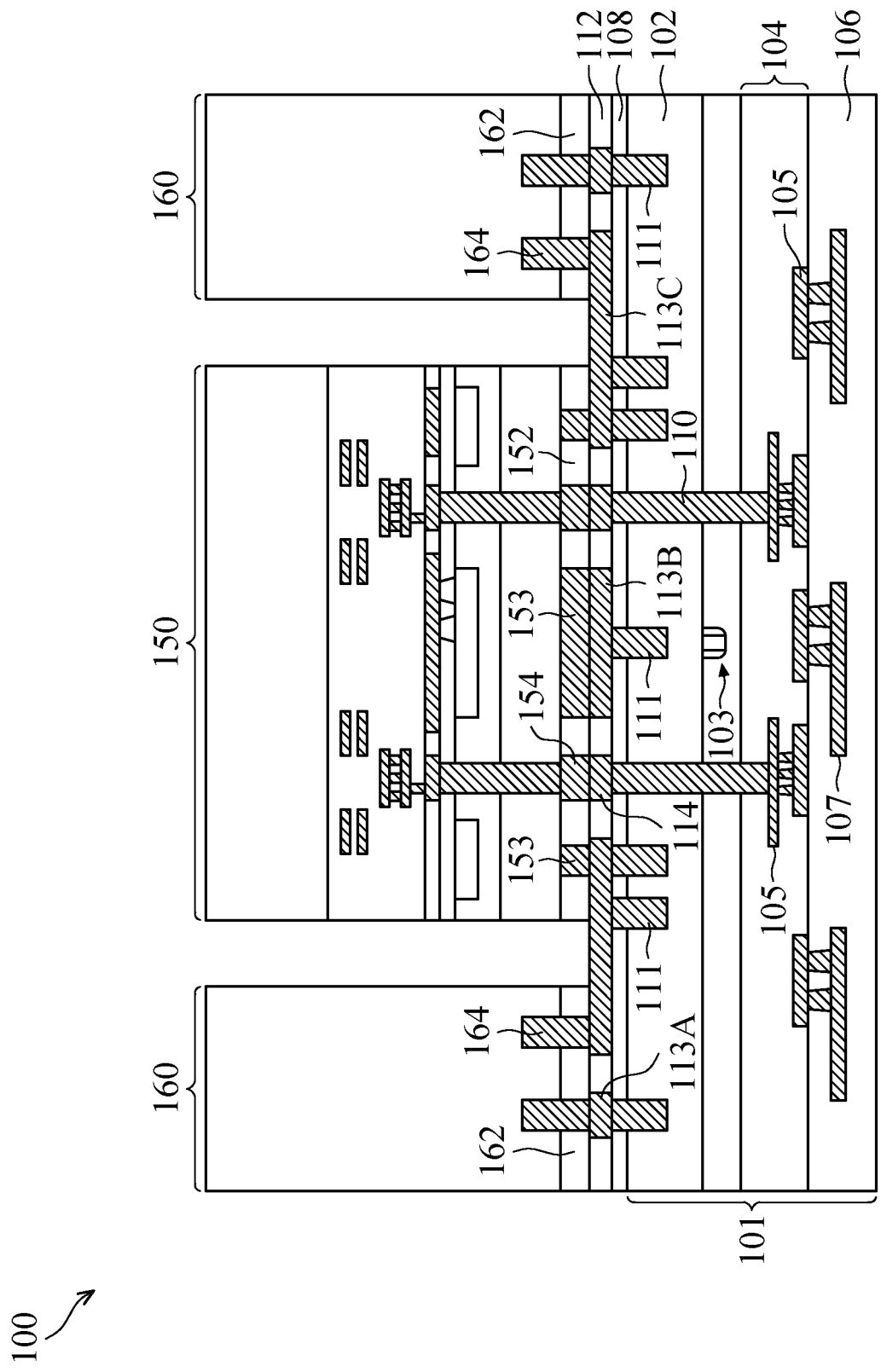

In FIG. 6, semiconductor devices 150 and thermal structures 160 are bonded to the semiconductor die 101, in accordance with some embodiments. For example, as shown in FIG. 6 the semiconductor device 150 and thermal structures 160 are bonded to the bonding layer 112, the thermal pads 113, and/or the bonding pads 114. In this manner, the semiconductor devices 150 and the thermal structures 160 may be collectively referred to herein as the "bonded components." Any suitable number or types of semiconductor devices 150 or thermal structures 160 may be bonded to the semiconductor die 101 in any suitable arrangement.

The semiconductor devices 150 may include, for example, a chip, a die, an integrated circuit device, or the like. For example, a semiconductor device 150 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). In some embodiments, a semiconductor device 150 is a stacked device that includes multiple semiconductor substrates. For example, a semiconductor device 150 may be a memory device that includes multiple memory dies such as a hybrid memory cube (HMC) device, a high bandwidth memory (HBM) device, or the like. In such embodiments, the semiconductor device 150 includes multiple semiconductor substrates interconnected by through-substrate vias (TSVs) such as through-silicon vias. Other types or configurations of semiconductor devices 150 are possible, and semiconductor devices 150 of different types may be bonded to the semiconductor die 101, in some embodiments.

In some embodiments, the semiconductor devices 150 include a bonding layer 152 and bonding pads 154 formed in the bonding layer 152. In some embodiments, optional thermal pads 153 may also be formed in the bonding layer 152. The bonding pads 154 of a semiconductor device 150 are metal pads that are electrically connected to other conductive features or circuits within that semiconductor device 150. The thermal pads 153 are similar to the bonding pads 154, except that the bonding pads 154 are used to physically and electrically connect the semiconductor devices 150 to the bonding pads 114, and the thermal pads 153 are electrically isolated structures used to facilitate heat dissipation. In this manner, the thermal pads 153 may be considered "dummy pads," in some cases. The bonding layer 152 may surround the thermal pads 153 and the bonding pads 154, and may have a surface that is coplanar or level with surfaces of the thermal pads 153 and the bonding pads 154. The bonding layer 152, the thermal pads 153, and/or the bonding pads 154 may be used to bond the semiconductor devices 150 to the semiconductor die 101. For example, the bonding layer 152 may be bonded to the bonding layer 112 using direct bonding, fusion bonding, dielectric-to-dielectric bonding, oxide-to-oxide bonding, or the like. The bonding pads 154 may be bonded to bonding pads 114 using direct bonding, fusion bonding, metal-to-metal bonding, or the like. The thermal pads 153 may be bonded to thermal pads 113 using direct bonding, fusion bonding, metal-to-metal bonding, or the like, though in other embodiments, some thermal pads 153 may not be directly bonded to thermal pads 113.

The bonding layer 152 may be any suitable material for direct bonding, fusion bonding, dielectric-to-dielectric bonding, or the like. In some embodiments, the bonding layer 152 may be similar to the bonding layer 112. For example, the bonding layer 152 may be silicon oxide, silicon oxynitride, silicon nitride, or the like. The thermal pads 153 and the bonding pads 154 may be formed of materials suitable for direct bonding, fusion bonding, metal-to-metal bonding, or the like. For example, the thermal pads 153 and the bonding pads 154 may be formed of a metal, such as copper, aluminum, or the like. Other materials are possible.

Notably, the semiconductor devices 150 are bonded to the semiconductor die 101 without the use of solder connections (e.g., microbumps or the like). By directly bonding the semiconductor devices 150 to the semiconductor die 101, advantages can be achieved, such as, finer bump pitch; small form factor packages by using hybrid bonds; smaller bonding pitch scalability for chip I/O to realize high density die-to-die interconnects; improved mechanical endurance; improved electrical performance; reduced defects; and increased yield. Further, shorter die-to-die may be achieved between the semiconductor devices 150, which has the benefits of smaller form-factor, higher bandwidth, improved power integrity (PI), improved signal integrity (SI), and lower power consumption.

The thermal structures 160 may be structures bonded to the semiconductor die 101 that facilitate the dissipation of heat from the semiconductor die 101 (e.g., the devices 103) and/or from the semiconductor devices 150. As such, the thermal structures 160 may comprise one or more materials having a suitably high thermal conductivity. For example, the thermal structures 160 may comprise a material such as silicon (e.g., bulk silicon), silicon oxide, a ceramic, the like, or a combination thereof. The thermal structures 160 may be free of active and/or passive devices, and thus may be considered "dummy die" in some cases.

In some embodiments, the thermal structures 160 include a bonding layer 162 and thermal vias 164. The thermal vias 164 extend through the bonding layer 162 and may protrude into the thermal structures 160, as shown in FIG. 6. In other embodiments, thermal vias 164 are not formed. The bonding layer 162 and the thermal vias 164 may be used to bond the thermal structures 160 to the semiconductor die 101. For example, the bonding layer 162 may be bonded to the bonding layer 112, and the thermal vias 164 may be bonded to the thermal pads 113. In some embodiments, some thermal vias 164 may not be bonded to thermal pads 113. The bonding layer 162 may be formed of materials similar to those described previously for the bonding layer 152 of a semiconductor device 150, and may be formed using similar techniques. The thermal vias 164 may be formed of materials similar to those described previously for the bonding pads 154 of a semiconductor device 150, and may be formed using similar techniques. Other materials or formation techniques are possible.

In some embodiments, the semiconductor devices 150 and the thermal structures 160 are bonded to the semiconductor die 101 using, for example, dielectric-to-dielectric bonding, metal-to-metal bonding, or a combination thereof (e.g., "hybrid bonding"). In some embodiments, an activation process may be performed on the bonding surfaces of the semiconductor die 101 (e.g., the bonding layer 112, the thermal pads 113, and the bonding pads 114), the bonding surfaces of the semiconductor devices 150 (e.g., the bonding layer 152, the thermal pads 153, and the bonding pads 154), and the bonding surfaces of the thermal structures 160 (e.g., the bonding layer 162 and the thermal vias 164) prior to bonding.

Activating the bonding surfaces of the semiconductor die 101, the semiconductor devices 150, and/or the thermal structures 160 may comprise a dry treatment, a wet treatment, a plasma treatment, exposure to an inert gas plasma, exposure to $H_2$, exposure to $N_2$, exposure to $O_2$, a combination thereof, or the like. For embodiments in which a wet treatment is used, an RCA cleaning may be used. In other embodiments, the activation process may comprise other types of treatments. The activation process facilitates bonding of the semiconductor devices 150 and the thermal structures 160 to the semiconductor die 101.

After the activation process, the bonding surfaces of the semiconductor devices 150 and the thermal structures 160 may be placed into contact with the bonding surfaces of the semiconductor die 101. For example, the bonding layer 152 of each semiconductor device 150 may be placed into physical contact with the bonding layer 112, and the bonding pads 154 of each semiconductor device 150 may be placed into physical contact with corresponding bonding pads 114. Thermal pads 153 of each semiconductor device 150 may also be placed into physical contact with corresponding thermal pads 113. Similarly, the bonding layer 162 of each thermal structure 160 may be placed into physical contact with the bonding layer 112, and the thermal vias 164 of each thermal structure 160 may be placed into physical contact with corresponding thermal pads 113. In some cases, the bonding process between bonding surfaces begins as the bonding surfaces physically contact each other.

In some embodiments, a thermal treatment is performed after the bonding surfaces are in physical contact. The thermal treatment may strengthen the bonding between the bonded components and the semiconductor die 101, in some cases. The thermal treatment may include a process temperature in the range of about 200° C. to about 400° C., though other temperatures are possible. In this manner, the semiconductor devices 150, the thermal structures 160, and the wafer 100 are bonded using dielectric-to-dielectric bonding and/or metal-to-metal bonding. Additionally, while specific processes have been described to initiate and strengthen the bonds between the semiconductor devices 150, the thermal structures 160, and the semiconductor die 101, these descriptions are intended to be illustrative and are not intended to be limiting upon the embodiments. Rather, any suitable combination of baking, annealing, pressing, or other bonding processes or combination of processes may be utilized. All such processes are fully intended to be included within the scope of the embodiments.

In some embodiments, a thermal pad 113 of the semiconductor die 101 may extend continuously underneath two or more bonded components (e.g., semiconductor devices 150 and/or thermal structures 160). In this manner, "cross-die" thermal pads 113 may be formed. The bonded components may or may not be directly bonded to the thermal pad 113. For example, as shown in FIG. 6, a thermal pad 113C extends from underneath a semiconductor device 150 to underneath a thermal structure 160. Additionally, a thermal pad 153 of the semiconductor device and a thermal via 164 of a thermal structure 160 are bonded to the same thermal pad 113C. Forming thermal pads 113 that extend between bonded components in this manner can facilitate improved heat dissipation within a semiconductor package 100. For example, in some embodiments, cross-die thermal pads 113 as described herein can allow for more efficient dissipation of heat away from devices 103 and/or semiconductor devices 150 and toward thermal structures 160. In some embodiments, thermal pads 113 or portions thereof may extend under more than two bonded components and/or may extend only partially across a region between bonded components.

Figure 7A:
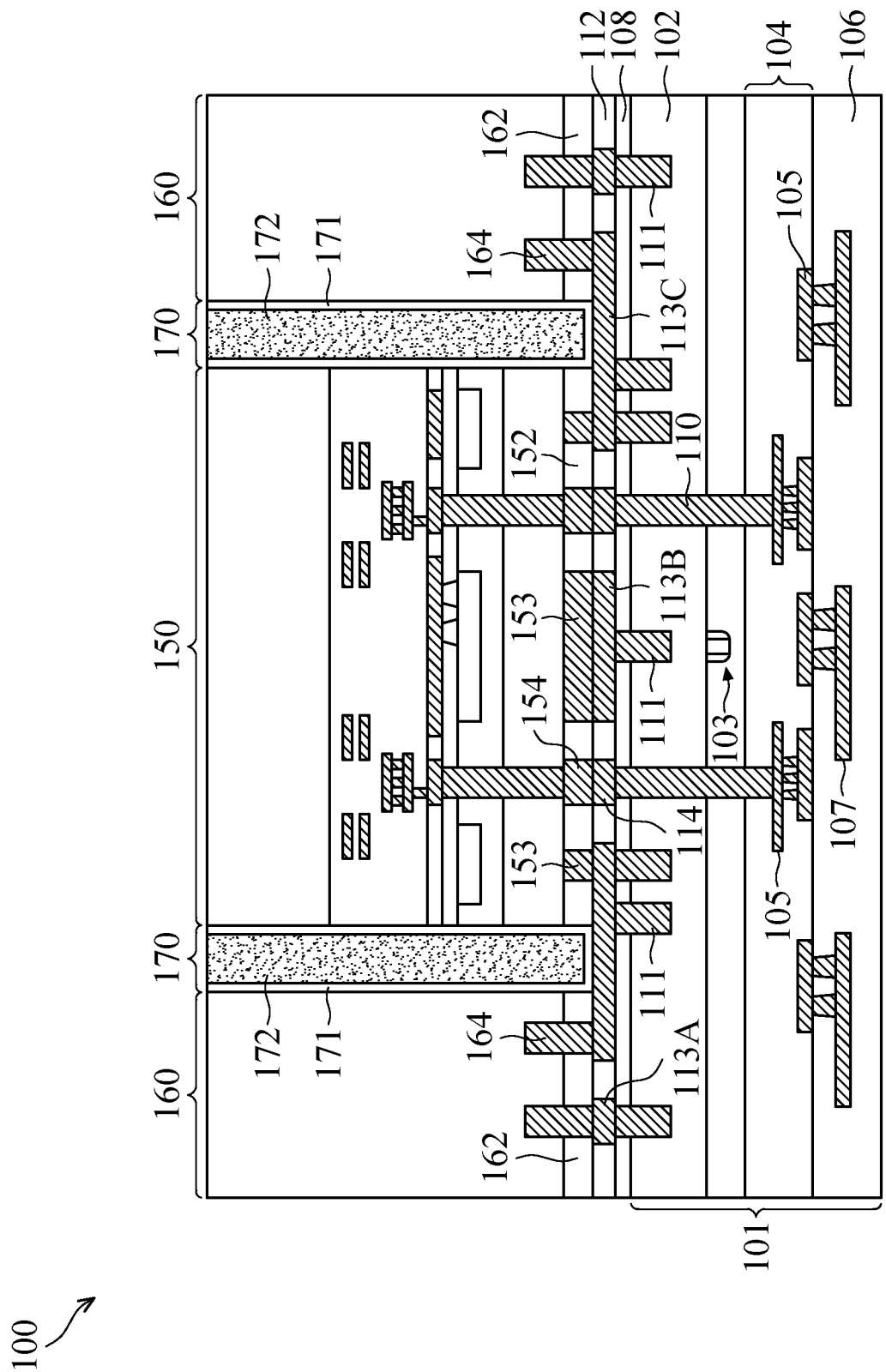
Figure 7B:
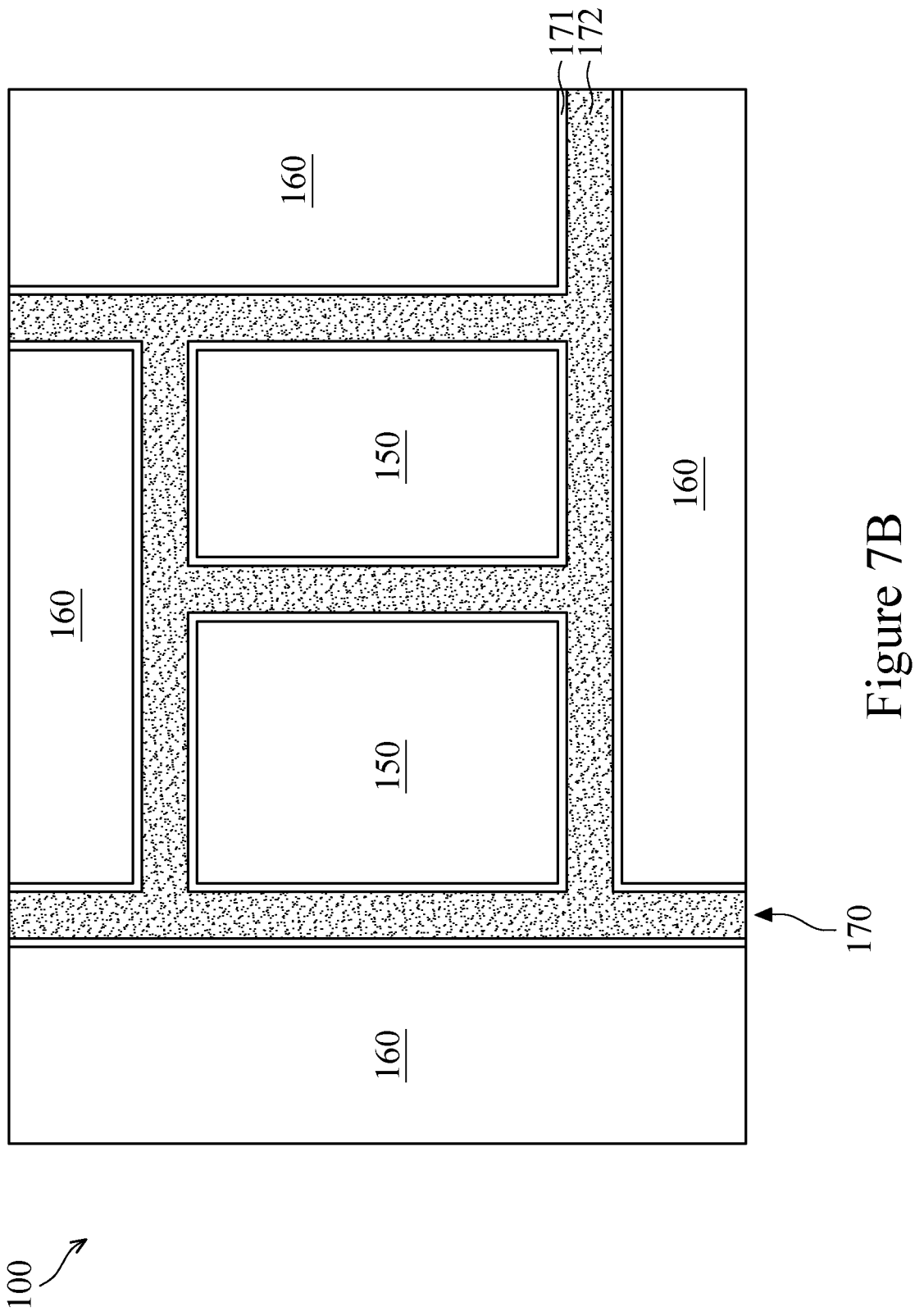

In FIGS. 7A and 7B, thermal fill regions 170 are formed between the bonded components, in accordance with some embodiments. FIG. 7A is a cross-sectional view, and FIG. 7B is a top-down view of a structure similar to that shown in FIG. 7A. The structure shown in FIG. 7B is an illustrative example, and other configurations or arrangements of features are possible, and all such variations are considered within the scope of the present disclosure. The thermal fill regions 170 comprise a material with a high thermal conductivity, such as metal, that allows heat to be more efficiently dissipated away from the semiconductor devices 150 and/or the semiconductor die 101. The thermal fill regions 170 may be, for example, structures that fill the gaps between neighboring bonded components, such as the gaps between neighboring semiconductor devices 150 and/or thermal structures 160. As shown in FIG. 7B, the thermal fill regions 170 may partially laterally surround or fully laterally surround the semiconductor devices 150 and/or the thermal structures 160. In some embodiments, some portions of the thermal fill regions 170 are formed on and physically contact thermal pads 113, which can facilitate heat dissipation from these thermal pads 113 into the overlying thermal fill regions 170. In this manner, the use of thermal fill regions 170 as described herein can improve the efficiency of heat dissipation within the semiconductor package 100.

As an example of forming thermal fill regions 170, a barrier layer 171 may first be deposited over the structure, in accordance with some embodiments. For example, the barrier layer 171 may be blanket deposited over top surfaces and sidewalls of the bonded components, and on exposed surfaces of the bonding layer 112 and/or thermal pads 113 between neighboring bonded components. In some embodiments, the barrier layer 171 may comprise a material such as titanium, titanium nitride, tantalum, tantalum nitride, the like, or a combination thereof. In some embodiments, the barrier layer 171 may comprise silicon oxide, silicon nitride, aluminum oxide, aluminum nitride, the like, or a combination thereof. The barrier layer 171 may be deposited using one or more suitable techniques, such as ALD, PVD, CVD, PECVD, plating, or the like. Other materials or deposition techniques are possible. The barrier layer 171 may help block diffusion of the metal fill material 172 in some cases. In other embodiments, a barrier layer 171 is not deposited.

A metal fill material 172 may then be deposited over the barrier layer 171, in accordance with some embodiments. The metal fill material 172 may overfill the gaps between the bonded components and may extend over the bonded components, in some embodiments. The metal fill material 172 may laterally surround some of the bonded components (e.g., the individual semiconductor devices 150 and/or thermal structures 160). The metal fill material 172 may comprise one or more materials having a high thermal conductivity, such as materials having a higher thermal conductivity than bulk silicon, molding compound, some dielectrics (e.g., oxides, nitrides, or the like), or other gap-filling materials. For example, the metal fill material 172 may comprise one or more metals, such as copper, copper alloy, titanium, tungsten, aluminum, or the like. Other materials are possible. In some embodiments, the metal fill material 172 is formed by first depositing a seed layer (not separately illustrated) over the barrier layer 171. In some embodiments, the seed layer is a metal layer, which may be a single layer or a composite layer comprising a plurality of sub-layers formed of different materials. The seed layer may be a conductive material and may be blanket deposited over the barrier layer 171 using a suitable process, such as sputtering, evaporation, PVD, or the like. In some embodiments, the seed layer comprises copper. Other materials or techniques are possible. The metal fill material 172 may then be deposited on the seed layer. The metal fill material 172 may be formed, for example, using a plating process, such as an electroplating process or an electroless plating process, or the like. Other deposition techniques are possible.

After depositing the metal fill material 172, a planarization process may be performed to remove excess metal fill material 172 and barrier layer 171, in accordance with some embodiments. The planarization process may be, for example, a CMP process, a grinding process, or the like. After performing the planarization process, the remaining portions of the metal fill material 172 and barrier layer 171 form the thermal fill regions 170. In some embodiments, after performing the planarization process, top surfaces of the thermal fill regions 170 and the bonded components may be substantially coplanar or level. In some cases, the top surfaces of the thermal fill regions 170 may be concave (e.g., due to dishing), convex, or substantially flat.

Figure 8:
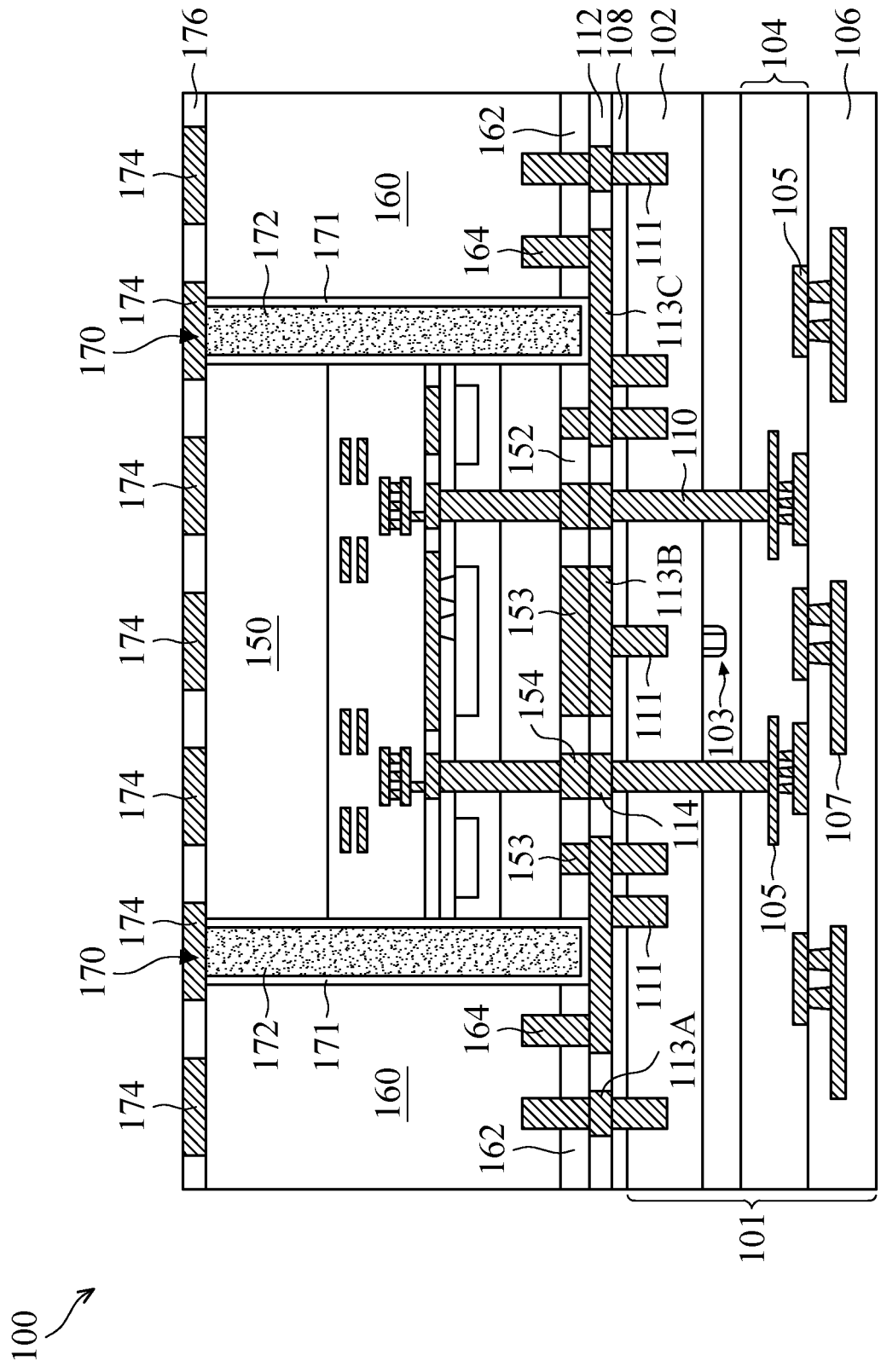

In FIG. 8, a bonding layer 176 and bonding pads 174 are formed, in accordance with some embodiments. The bonding layer 176 and bonding pads 174 may be subsequently used to bond a support structure 180 (see FIG. 9). For example, the bonding layer 176 may be used for a bonding process such as direct bonding, fusion bonding, dielectric-to-dielectric bonding, oxide-to-oxide bonding, or the like. The bonding pads 174 may be used for a bonding process such as direct bonding, fusion bonding, metal-to-metal bonding, or the like. In some embodiments, the bonding layer 176 and the bonding pads 174 are all utilized for bonding (e.g., "hybrid bonding"). The bonding layer 176 may be formed using materials or techniques similar to those described previously for the bonding layer 112, in some embodiments. The bonding pads 174 may be formed using materials or techniques similar to those described previously for the bonding pads 114, in some embodiments. In some cases, the bonding pads 174 may also facilitate heat dissipation within the semiconductor package 100. For example, the bonding pads 174 may be formed on the semiconductor devices 150, on the thermal structures, and on the thermal fill regions 170. In this manner, heat may be more efficiently dissipated into an overlying support structure 180, for example.

Figure 9:
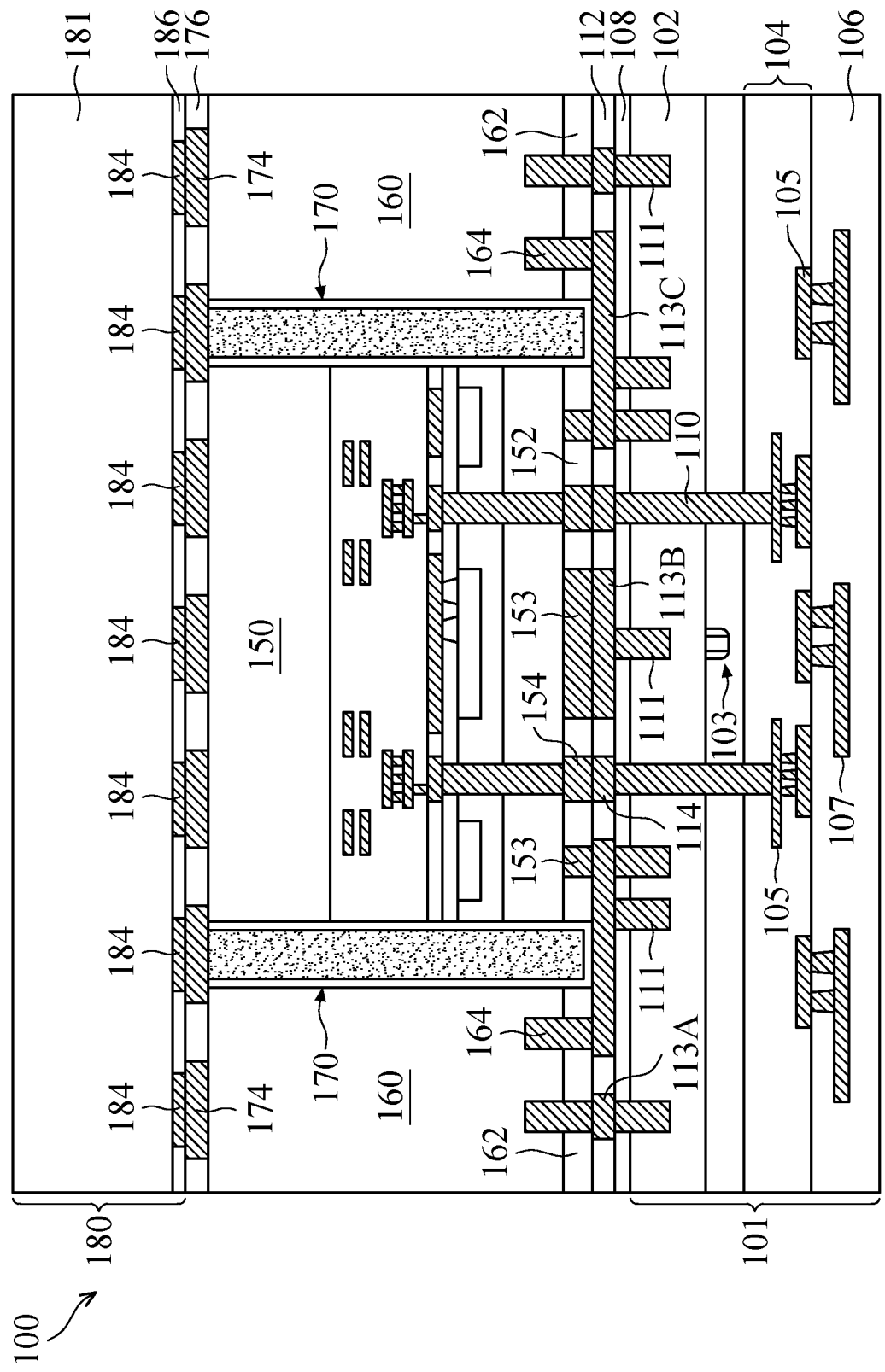

FIG. 9 illustrates the bonding of a support structure 180, in accordance with some embodiments. In this manner, a semiconductor package 100 may be formed, in accordance with some embodiments. The support structure 180 may be bonded to the bonding layer 176 and the bonding pads 174 to provide structural support and to facilitate heat dissipation for the semiconductor package 100. The support structure 180 shown in FIG. 9 is an example, and the support structure 180 may have different layers, different features, or a different configuration in other embodiments. In some embodiments, the support structure 180 includes a bonding layer 186 and bonding pads 184 formed on a support substrate 181. In other embodiments, the support structure 180 is omitted.

The support substrate 181 may be, for example, a semiconductor material such as silicon (e.g., bulk silicon, a silicon wafer, or the like), a glass material, a ceramic material, a metal material, or the like. Other materials are possible. The bonding pads 184 may be formed in a bonding layer 186, which may be similar to the bonding pads 174 and the bonding layer 176 described previously. For example, the bonding layer 186 may be used for a bonding process such as direct bonding, fusion bonding, dielectric-to-dielectric bonding, oxide-to-oxide bonding, or the like. The bonding pads 184 may be used for a bonding process such as direct bonding, fusion bonding, metal-to-metal bonding, or the like. The bonding layer 184 may be directly bonded to the bonding layer 174, and the bonding pads 186 may be directly bonded to the bonding layer 176. The bonding process may be similar to the bonding process described previously for FIG. 6.

Figure 10:
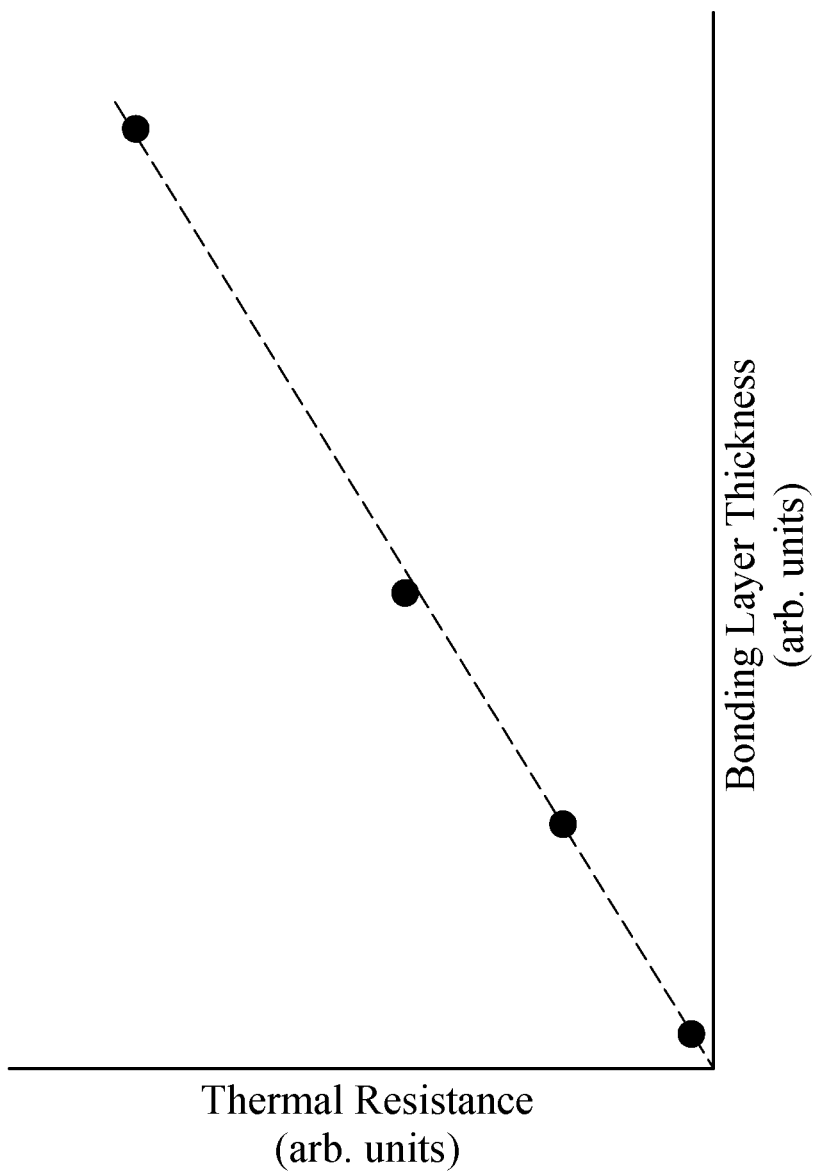
FIG. 10 illustrates simulation data of thermal resistance vs. bonding layer thickness, in accordance with some embodiments.

In some cases, thinning the bonding layer 112 and/or the bonding layer 162 can improve the heat dissipation of the semiconductor package 100. For example, FIG. 10 illustrates simulation data of the thermal resistance of a bonding layer 112 as a function of thickness. Four different thicknesses of the bonding layer 112 are shown with corresponding thermal resistances, along with a trendline. As FIG. 10 shows, the thermal resistance decreases approximately linearly with decreasing bonding layer 112. Thus, thermal resistance may be reduced, and heat dissipation correspondingly improved, by thinning the bonding layer 112 and/or the bonding layer 162. In some cases, thinning the bonding layer 112 to a thickness of about 100 Å can reduce the thermal resistance of a region around a device 103 by about 6% or more. A reduction of greater than 6% may be realized by thinning the bonding layer 112 smaller than 100 Å and/or by also thinning the bonding layer 162 of the thermal structures 160, in some cases. This is an example, and other reductions of thermal resistance may be realized for this or other thicknesses in other cases. In some cases, the reduction in thermal resistance due to bonding layer thinning is in addition to any reduction in thermal resistance due to the use of wider thermal pads 113.

Figure 11:
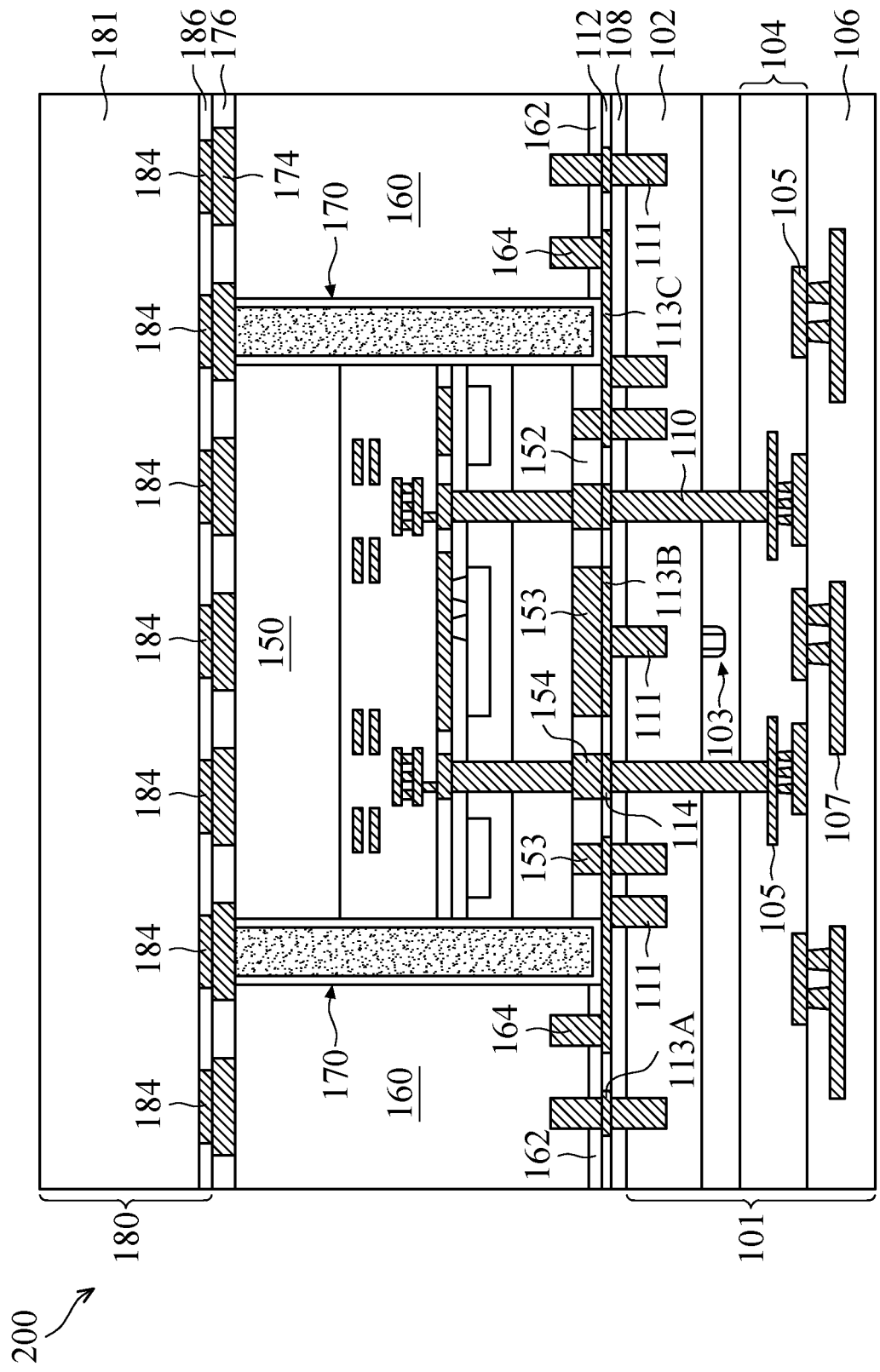
FIG. 11 illustrates a cross-sectional view of a semiconductor package, in accordance with some embodiments.

Turning to FIG. 11, a semiconductor package 200 with thinned bonding layers is shown, in accordance with some embodiments. The semiconductor package 200 is similar to the semiconductor package 100 shown in FIG. 9, except that the bonding layer 112 of the semiconductor die 101 and the bonding layers 162 of the thermal structures 160 are both thinned prior to bonding. In other embodiments, only one of the bonding layer 112 or the bonding layer(s) 162 is thinned. After performing the respective thinning processes, the bonding layer 112 and the bonding layer 162 may have the same thickness or may have different thicknesses. In other embodiments, the bonding layer 152 of the semiconductor device 150 may be thinned. The bonding layers 112/162 may be thinned using a suitable thinning process, such as a grinding process, a CMP process, an etching process, the like, or a combination thereof. In some embodiments, after performing a thinning process, a bonding layer 112/162 has a thickness in the range of about 100 Å to about 1000 Å. Other thicknesses are possible. For example, in some embodiments, a bonding layer 112/162 may be thinned to less than about 100 Å thick. In this manner, heat dissipation through the bonding layers 112/162 may be improved. In some embodiments in which the bonding layers 112 and 162 are thinned, the thermal pads 113 and/or the thermal vias 164 are omitted.

Figure 12:
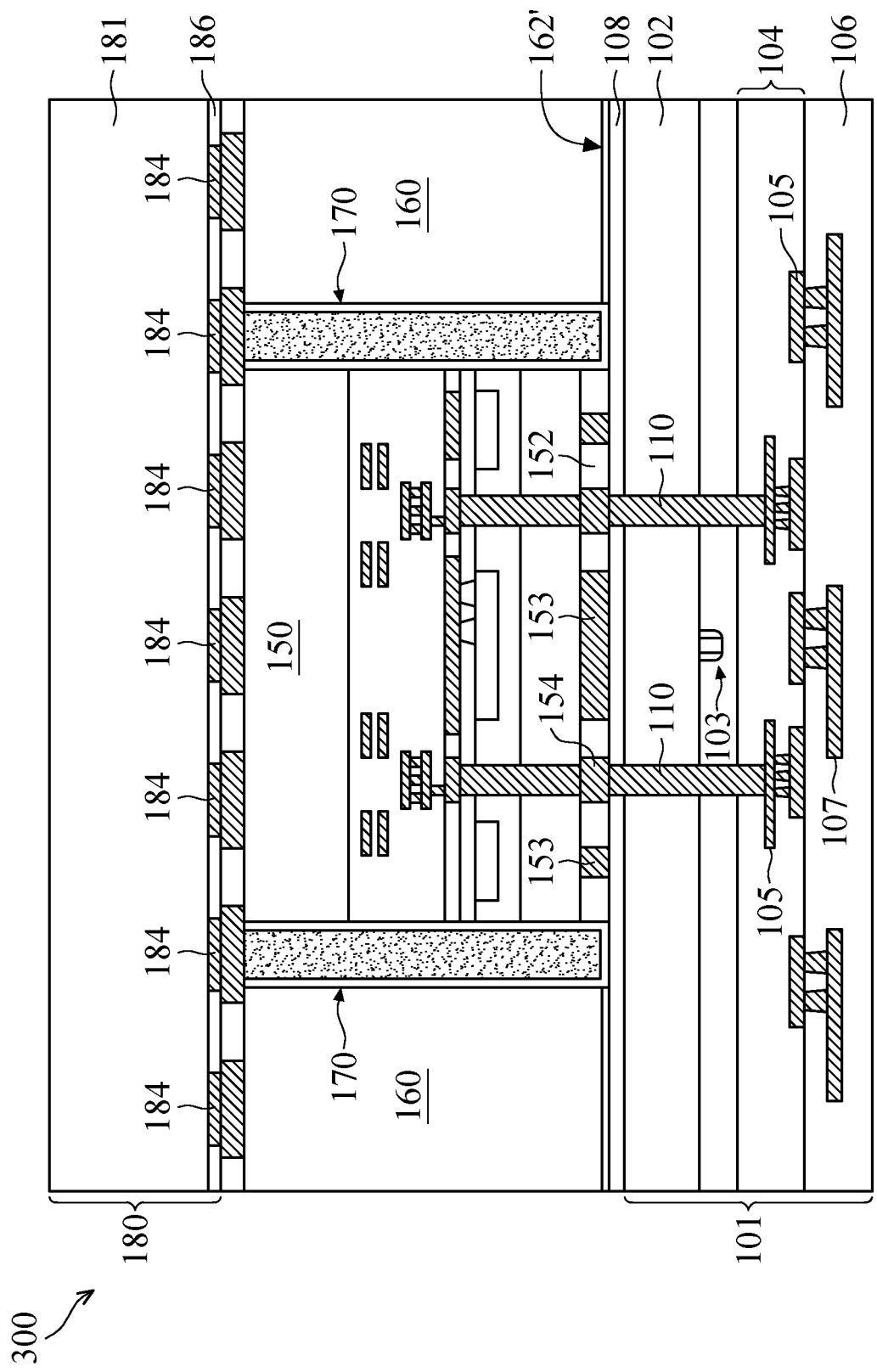
FIG. 12 illustrates a cross-sectional view of a semiconductor package, in accordance with some embodiments.

In some embodiments, the bonding layer 112 and/or the bonding layers 162 may be omitted, which can result in improved heat dissipation due to there being fewer layers for heat to travel through. FIG. 12 illustrates a semiconductor package 300 that is similar to the semiconductor package 100, except that the semiconductor package 300 is formed without the bonding layer 112 and without the bonding layers 162, in accordance with some embodiments. As shown in FIG. 12, in some embodiments, the thermal vias 111, the thermal pads 113, and/or the bonding pads 114 are omitted in addition to omitting the bonding layer 112. In some embodiments, the thermal vias 164 are omitted in addition to omitting the bonding layer 162. In other embodiments, the thermal vias 111 and/or the thermal vias 164 may be formed. The semiconductor devices 150 may or may not include thermal pads 153. The improvement to heat dissipation due to omitting the bonding layers 112/162 may be in addition to other improvements to heat dissipation described elsewhere herein, such as the use of a high thermal conductivity material for the isolation layer 108 or the use of thermal fill regions 170. In some cases, omitting the bonding layers 111/162 may reduce thermal resistance more than thinning the bonding layers 111/162.

In some embodiments without the bonding layer 112, the semiconductor devices 150 and the thermal structures 160 may be directly bonded to the isolation layer 108. For example, the bonding layers 152 of the semiconductor devices 150 may be bonded to the isolation layer 108 using direct bonding, fusion bonding, dielectric-to-dielectric bonding, or the like. In some embodiments, a layer of native oxide 162' (e.g., a silicon oxide or the like) may form on the thermal structures 160, and the thermal structures 160 may be bonded by bonding the native oxide layer 162' to the isolation layer 108 using direct bonding, fusion bonding, dielectric-to-dielectric bonding, or the like. These are examples, and other materials or techniques are possible.

The embodiments described herein can achieve some advantages. By using a high thermal conductivity material (e.g., aluminum nitride or aluminum oxide, though other materials are possible) as an isolation layer over a substrate comprising heat-generating devices, the dissipation of heat from the devices may be improved. In some cases, the dissipation of heat may be improved by thinning the isolation layer. Forming metallic dummy vias extending into the substrate as described herein can facilitate more efficient conduction of heat away from the devices. Metallic dummy bonding pads may be formed in a bonding layer over the isolation layer, which may also facilitate improved heat dissipation. Dummy structures may be bonded to the bonding layer to facilitate heat dissipation. Some embodiments herein describe forming large (e.g., having a width of about 5 µm or larger) metallic dummy bonding pads, which can significantly improve the dissipation of heat from the devices. Thinning the bonding layer (e.g., to less than about 500 Å) and/or bonding layers of the dummy structures as described herein can also improve the efficiency of heat dissipation. In some embodiments, the bonding layer over the substrate and/or the bonding layers of the dummy structures may be omitted, which reduces thermal resistance and improves heat dissipation. In such embodiments, dummy structures and other devices are bonded to the isolation layer. Additionally, a metallic material may be deposited to gap-fill the regions between dummy structures or other devices, which allows for more efficient heat dissipation. The various advantageous features described herein may be combined or designed flexibly for particular applications or desired characteristics. In this manner, a package with improved heat dissipation may be formed.

In accordance with some embodiments, a device package includes a first die including a semiconductor substrate; an isolation layer on the semiconductor substrate, wherein the isolation layer is a first dielectric material; a first dummy via penetrating through the isolation layer and into the semiconductor substrate; a bonding layer on the isolation layer, wherein the bonding layer is a second dielectric material that has a smaller thermal conductivity than the first dielectric material; a first dummy pad within the bonding layer and on the first dummy via; a dummy die directly bonded to the bonding layer; a second die directly bonded to the bonding layer and to the first dummy pad; and a metal gap-fill material between the dummy die and the second die. In an embodiment, the isolation layer includes aluminum nitride or aluminum oxide. In an embodiment, the second dielectric material is free of aluminum. In an embodiment, the bonding layer has a thickness of less than 500 Å. In an embodiment, the first dummy pad has a width that is greater than 5 µm. In an embodiment, the first dummy pad extends underneath both the second die and the dummy die. In an embodiment, the dummy die is directly bonded to the first dummy pad. In an embodiment, the metal gap-fill material physically contacts the first dummy pad. In an embodiment, top surfaces of the metal gap-fill material, the dummy die, and the second die are level.

In accordance with some embodiments, a package includes a first die; a bonding layer covering a first side of the first die, wherein the bonding layer is a dielectric material including aluminum; a second die bonded to the bonding layer with dielectric-to-dielectric bonds; a through via penetrating through the bonding layer, wherein the through via is electrically connected to the first die and the second die; a thermal structure bonded to the bonding layer with dielectric to dielectric bonds; and a metallic thermal material laterally surrounding the second die, wherein the metallic thermal material physically contacts a top surface of the bonding layer, a sidewall of the second die, and a sidewall of the thermal structure. In an embodiment, the thermal structure includes bulk silicon. In an embodiment, the thermal structure includes a native silicon oxide layer, wherein the native silicon oxide layer is bonded to the bonding layer with dielectric to dielectric bonds. In an embodiment, the metallic thermal material includes copper over a barrier layer. In an embodiment, the bonding layer includes aluminum nitride or aluminum oxide. In an embodiment, the second die includes dummy bonding pads.

In accordance with some embodiments, a method includes depositing a layer of a first dielectric material over a first semiconductor die; forming dummy vias penetrating through the first dielectric material and into the first semiconductor die; depositing a layer of a second dielectric material over the first dielectric material; forming dummy pads and bonding pads in the second dielectric material, wherein at least one dummy pad physically contacts at least one dummy via; performing a first thinning process on the layer of the second dielectric material; bonding a dummy semiconductor die to the second dielectric material using fusion bonding; bonding a second semiconductor die to the second dielectric material using fusion bonding; and filling a region extending between the dummy semiconductor die and the second semiconductor die with a metal material. In an embodiment, the first dielectric material is aluminum oxide and the second dielectric material is silicon oxide. In an embodiment, the method includes performing a second thinning process on the first dielectric material. In an embodiment, after performing the first thinning process the layer of the second dielectric material has a thickness of less than 500 Å. In an embodiment, the method includes, before bonding the dummy semiconductor die, performing a third thinning process on a bonding layer of the dummy semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprising:
   a first die comprising a semiconductor substrate;
   an isolation layer on the semiconductor substrate, wherein the isolation layer is a first dielectric material;
   a first dummy via penetrating through the isolation layer and into the semiconductor substrate;
   a bonding layer on the isolation layer, wherein the bonding layer is a second dielectric material that has a smaller thermal conductivity than the first dielectric material;
   a first dummy pad within the bonding layer and on the first dummy via;
   a dummy die directly bonded to the bonding layer;
   a second die directly bonded to the bonding layer and to the first dummy pad; and
   a metal gap-fill material between the dummy die and the second die.

2. The device package of claim 1, wherein the isolation layer comprises aluminum nitride or aluminum oxide.

3. The device package of claim 1, wherein the second dielectric material is free of aluminum.

4. The device package of claim 1, wherein the bonding layer has a thickness of less than 500 Å.

5. The device package of claim 1, wherein the first dummy pad has a width that is greater than 5 μm.

6. The device package of claim 1, wherein the first dummy pad extends underneath both the second die and the dummy die.

7. The device package of claim 6, wherein the dummy die is directly bonded to the first dummy pad.

8. The device package of claim 1, wherein the metal gap-fill material physically contacts the first dummy pad.

9. The device package of claim 1, wherein top surfaces of the metal gap-fill material, the dummy die, and the second die are level.

10. A package comprising:
    a first die;
    a bonding layer covering a first side of the first die, wherein the bonding layer is a dielectric material comprising aluminum;
    a second die bonded to the bonding layer with dielectric-to-dielectric bonds;
    a through via penetrating through the bonding layer, wherein the through via is electrically connected to the first die and the second die;
    a thermal structure bonded to the bonding layer with dielectric to dielectric bonds; and
    a metallic thermal material laterally surrounding the second die, wherein the metallic thermal material physically contacts a top surface of the bonding layer, a sidewall of the second die, and a sidewall of the thermal structure.

11. The package of claim 10, wherein the thermal structure comprises bulk silicon.

12. The package of claim 10, wherein the thermal structure comprises a native silicon oxide layer, wherein the native silicon oxide layer is bonded to the bonding layer with dielectric to dielectric bonds.

13. The package of claim 10, wherein the metallic thermal material comprises copper over a barrier layer.

14. The package of claim 10, wherein the bonding layer comprises aluminum nitride or aluminum oxide.

15. The package of claim 10, wherein the second die comprises dummy bonding pads.

16. A device comprising:
    a layer of a first dielectric material over a first semiconductor die;
    a plurality of dummy vias penetrating through the first dielectric material and into the first semiconductor die;
    a layer of a second dielectric material over the first dielectric material;
    a plurality of dummy pads and a plurality of bonding pads in the second dielectric material, wherein at least one dummy pad physically contacts at least one dummy via, wherein top surfaces of the plurality of dummy pads, the plurality of bonding pads, and the second dielectric material are level;
    a dummy semiconductor die directly bonded to the second dielectric material;
    a second semiconductor die directly bonded to the second dielectric material; and
    a metal material over the second dielectric material and extending from the dummy semiconductor die to the second semiconductor die.

17. The device of claim 16, wherein the first dielectric material is aluminum oxide and the second dielectric material is silicon oxide.

18. The device of claim 16, wherein top surfaces of the plurality of dummy vias and the first dielectric material are level.

19. The device of claim 16, wherein the layer of the second dielectric material has a thickness that is less than 500 Å.

20. The device of claim 16 further comprising a barrier layer sandwiched between the metal material and the dummy semiconductor die.

* * * * *